US011211512B2

(12) United States Patent
Schueppen et al.

(10) Patent No.: US 11,211,512 B2
(45) Date of Patent: Dec. 28, 2021

(54) SEMICONDUCTOR COMPONENT HAVING A HIGHLY DOPED QUANTUM STRUCTURE EMITTER

(71) Applicant: AE 111 Autarke Energie GmbH, Liebenfels (AT)

(72) Inventors: Andreas Paul Schueppen, Graz (AT); Rainer Stowasser, Hart Bei Graz (AT)

(73) Assignee: AE 111 AUTARKE ENERGIE GMBH, Liebenfels (AT)

( * ) Notice: Subject to any disclaimer, the term of this patent is extended or adjusted under 35 U.S.C. 154(b) by 0 days.

(21) Appl. No.: 16/767,903

(22) PCT Filed: Nov. 22, 2018

(86) PCT No.: PCT/EP2018/082222
§ 371 (c)(1),
(2) Date: May 28, 2020

(87) PCT Pub. No.: WO2019/120859
PCT Pub. Date: Jun. 27, 2019

(65) Prior Publication Data
US 2020/0295215 A1    Sep. 17, 2020

(30) Foreign Application Priority Data
Dec. 21, 2017   (EP) ..................................... 17209638

(51) Int. Cl.
*H01L 31/00* (2006.01)
*H01L 31/0725* (2012.01)
*H01L 31/0352* (2006.01)

(52) U.S. Cl.
CPC .. *H01L 31/0725* (2013.01); *H01L 31/035209* (2013.01)

(58) Field of Classification Search
CPC ................... H01L 31/0725; H01L 31/035209
See application file for complete search history.

(56) References Cited

U.S. PATENT DOCUMENTS

| 5,059,045 | A | 10/1991 | Mrvos et al. |
| 2005/0056827 | A1 | 3/2005 | Li et al. |
| 2005/0092357 | A1* | 5/2005 | Deng ................ H01L 31/03765 136/252 |
| 2014/0077210 | A1* | 3/2014 | Hekmatshoartabari ..................... H01L 31/1055 257/53 |
| 2014/0209156 | A1* | 7/2014 | Schuppen ............... H01L 29/04 136/255 |

FOREIGN PATENT DOCUMENTS

| DE | 102005047221 A1 | 4/2007 |
| EP | 2469608 A1 | 6/2012 |

* cited by examiner

*Primary Examiner* — Angelo Trivisonno
(74) *Attorney, Agent, or Firm* — Slater Matsil, LLP

(57) ABSTRACT

A semiconductor device having a highly doped quantum structure emitter is disclosed. In an embodiment, the semiconductor device includes a quantum structure emitter. The quantum structure emitter includes of a first layer made of an undoped semiconductor material with a large band gap, a second, middle, highly doped layer made of a semiconductor material with a low band gap and a third, undoped layer made of a semiconductor material with a large band gap.

17 Claims, 2 Drawing Sheets

SEMICONDUCTOR COMPONENT HAVING A HIGHLY DOPED QUANTUM STRUCTURE EMITTER

This patent application is a national phase filing under section 371 of PCT/EP2018/082222, filed Nov. 22, 2018, which claims the priority of European patent application 17209638.0, filed Dec. 21, 2017, each of which is incorporated herein by reference in its entirety.

TECHNICAL FIELD

A semiconductor component, in particular a solar cell, comprising a highly doped quantum structure emitter is provided.

BACKGROUND

Silicon solar cells are produced and marketed commercially on a grand scale since the beginning of this chiliad. There are currently the following important technologies with the following performance efficiencies:

World records: Crystalline III-V, 44.7%, thin film a-Si/c-Si, 20.8%, thin Film CIGS, 20.5%, thin film CdTe, 21.0% and crystalline silicone, 25.6%.

Production:

Crystalline III-V, 25%, thin film a-Si, 19% and thin Film CIGS, 10% to 13%.

Solar cells based on crystalline silicon: Standard Silicone, 18% to 19%, PERC, 20% to 21%, HJT, 23% to 25% and IBC of the manufacturer Sunpower, 24% to 25%.

In this context, CIGS means copper-indium-gallium diselenide. PERC means Passivated Emitter Rear Cell, wherein the efficiency of the solar cell is increased by passivating the rear side so that light which reaches the rear side without having produced free charge carriers is reflected back into the cell. HJT refers to heterojunction technology, that is, to solar cells having a plurality of charge carrier generation regions. IBC means Interdigited Back Contact, wherein all electrical contacts lie on a rear side of the cell so that shading due to a front contact finger structure is prevented.

At present, there is no production technology for terrestrial applications having more than 23% efficiency in a cost efficient manner. It is also the case with conventional solar cells that the real power efficiency has dropped to approximately half at a temperature of approximately 85° C. As a result, the use of conventional solar cells is greatly restricted, in particular in desert regions.

Bifacial solar cells, which also use the rear scattered light, brought an improvement in this case. However, these solar cells do not solve the problem of temperature coefficient, briefly TK, of silicon solar cells. A promising approach are HJT and PERC cells, which are produced above all in newly installed solar factories and which combine monocrystalline silicon with amorphous silicon, above all for the contact regions. Even in these cells, only efficiencies of less than 25% are achieved in the laboratory, and power TK cannot significantly be reduced by these cell types.

SUMMARY OF THE INVENTION

Embodiments provide a semiconductor component such as a solar cell which has a high efficiency and a reduced temperature coefficient.

Various embodiments increase the efficiency of silicon-based solar cells to over 30% and to more than bisect the temperature coefficient of the power efficiency of modules of presently about −0.4%/K. In particular, this also results in significantly increasing an open terminal voltage, Voc, and/or a short-circuit current, Isc for short. Due to the positive temperature coefficient of the Isc, it is particularly useful to increase the current and not only the voltage of the cell.

Further embodiments provide the ability to produce the proposed solar cell with known techniques and cost-effectively.

By increasing the open terminal voltage Voc, the usable voltage range may be increased. For example, alpha-silicon can be introduced into a space charge region, as is attempted in HJT cells. Voc values of up to 0.74 V were achieved. However, since the TK is determined primarily by the band gap reduction in the event of an increase in temperature, this is not a solution in order to reduce the TK.

This can be achieved in particular in that a quantum structure is embedded in the emitter and/or collector or also in the transition area of these two zones, the quantum structure reduces the temperature coefficient TK and at the same time increases the current. In this case, the TK is reduced by the introduction of a quantum structure, which preferably consists of two tunnel barriers and a quantum well. As a result of incident light, electron-hole pairs are produced above all in the quantum well, which consists in particular of SiGe, and are moved to the contacts by the electric field which is produced by the pn junction. Since so-called mini bands or subbands are produced in the quantum well by the adjacent tunnel barriers, the reduction of the band gap by increasing the temperature is hardly perceptible to the exterior. Moreover, the tunnel effect is independent of temperature.

The cell proposed here therefore has a highly doped emitter which consists of a quantum structure of silicon-germanium, that is, $Si_xGe_{1-x}$, and carbon C. This has the advantage that the light absorption for all wavelengths is greater by at least a factor of 100 than would be the case for pure silicon, wherein typically $x \leq 0.8$ applies, which corresponds to a germanium content of greater than 20%. The higher the proportion of germanium, the greater the absorption. The thickness of the silicon germanium layer is limited by the formation of so-called subbands and should therefore be below 12 nm.

In at least one embodiment, the semiconductor device, which is preferably a solar cell, comprises at least one quantum structure emitter. The quantum structure emitter comprises a first layer made of an undoped semiconductor material having a large band gap, a second, middle, highly doped layer made of a semiconductor material having a low band gap, and a third, undoped layer made of a semiconductor material having a large band gap. The quantum structure emitter preferably consists of these three layers.

According to at least one embodiment, the band gap of the first and/or the third layer is at least 1.5 eV, preferably at least 2 eV. Due to the high band gap, the first and the third layer can also be regarded as barrier layers of the quantum structure emitter.

According to at least one embodiment, the band gap of the second layer is at most 0.9 eV, preferably at most 0.66 eV. Alternatively or additionally, a dopant concentration of the second layer is at least $5 \times 10^{18}$ 1/cm$^3$, preferably at least $1 \times 10^{19}$ 1/cm$^3$. Due to the small band gap, the second layer can also be regarded as an emitter layer or quantum well layer of the quantum structure emitter.

According to at least one embodiment, the at least three layers of the quantum structure emitter each satisfy the tunnel conditions. That is, for example, a charge carrier such as an electron can overcome a potential barrier caused by the layers even if its energy is less than the height of the barrier due to the layers. For example, this means that the layers each have a thickness of at most 10 nm, preferably of at most 7 nm. A minimum thickness of these layers lies at a monolayer, preferably at at least 1 nm.

According to at least one embodiment, a total thickness of the quantum structure emitter is at most 15 nm, preferably at most 10 nm. This makes it possible for the quantum structure emitter overall to fulfill the tunnel conditions.

According to at least one embodiment, the second layer is doped until degenerate. This means in particular that the valence band lies above the Fermi level as in a metal.

According to at least one embodiment, the first and/or the third layer consist of a carbide, in particular of a semiconductor carbide such as SiC, GeC, or SiGeC. That is, these layers are each composed of $(Si_yGe_{1-y})_{1-x}C_x$. In this case, $0.01 \le x \le 0.5$ or $0.05 \le x \le 0.5$ or $0.25 \le x \le 0.75$ applies, preferably $0.4 \le x \le 0.6$. Alternatively or additionally, $0 \le y \le 1$ applies, preferably $0.25 \le y \le 0.9$, particularly preferably $0.4 \le x \le 0.7$. The first and third layers can have the same or different material compositions, such that x, y can be different from each other for these layers.

Alternatively, the first and/or the third layer are made of an oxide such as $SiO_2$ or $Al_2O_3$. Although the aforementioned oxides are electrically insulating as a bulk material, because of the small thickness of preferably at most 10 nm or 5 nm, these layers can be regarded as semiconductor material layers in the quantum structure emitter.

According to at least one embodiment, the second layer is made of SiGe. In this way, the second layer preferably has a comparatively low band gap in comparison to the first and to the third layer. In particular, the second layer is of $Si_zGe_{1-z}$ wherein $0 \le z \le 1$ applies, in particular $0.1 \le z \le 0.95$, preferably $0.6 \le z \le 0.9$.

According to at least one embodiment, the first, second and/or third layers of the quantum structure emitter are made of $(Si, Ge)_{1-z}C_z$. In this case, preferably $0.05 \le z \le 0.6$ or $0.05 \le z \le 0.5$ applies, where any dopants present are negligible. Si and Ge may be present in any mixture ratios, including that only Si or only Ge is present. In addition, various phases can be mixed, for example, SiC and GeC. The expression $(Si, Ge)_{1-z}C_z$ can thus refer to an average composition over the respective layer. According to at least one embodiment, the quantum structure emitter forms at least part of a first diode. For example, the first diode is composed of the quantum structure emitter, a wafer, and an oppositely doped layer.

According to at least one embodiment, the semiconductor component comprises one or more second diodes. The at least one second diode can precede or follow the first diode. The second diode is made of at least one other semiconductor material than the first diode. The second diode has a smaller or, preferably, a greater band gap. The second diode can thus be designed to convert short-wavelength radiation into charge carriers, whereas the first diode is used to convert long-wavelength radiation into charge carriers.

According to at least one embodiment, groups II to VI of the periodic table are used for the semiconductor materials of the first diode and/or of the second diode. That is, the diodes may be composed, in particular, of II-VI compound semiconductor materials, III-V compound semiconductor materials, and/or IV semiconductor materials. In this case, different semiconductor materials can be combined with one another within the diodes or at least within the semiconductor component.

According to at least one embodiment, at least the layers of the quantum structure emitter are produced by means of a CVD method, a PECVD method, an ALD method and/or an MBE method or a similar method. CVD means Chemical Vapour Deposition, PECVD means Plasma Enhanced Chemical Vapour Deposition, ALD means Atomic Layer Deposition, and MBE means Molecular Beam Epitaxy.

According to at least one embodiment, the layers of the quantum structure emitter and/or the layers of the second diode are monocrystalline, polycrystalline or amorphous.

According to at least one embodiment, the layers of the quantum structure emitter and/or of the second diode extend in a planar and/or contiguous manner over the quantum structure emitter and/or across the semiconductor component. That is, the layers can extend with a constant layer thickness in an unchanged material composition over the entire component, in particular over an entire light collecting surface of the component.

BRIEF DESCRIPTION OF THE DRAWINGS

In the following, a semiconductor component described here will be explained in more detail with reference to the drawing on the basis of exemplary embodiments. Identical reference symbols indicate the same elements in the individual figures. However, relationships true to scale are shown here, but individual elements can be illustrated in an exaggerated fashion for better understanding.

In the figures.

DETAILED DESCRIPTION OF ILLUSTRATIVE EMBODIMENTS

Figure 1:
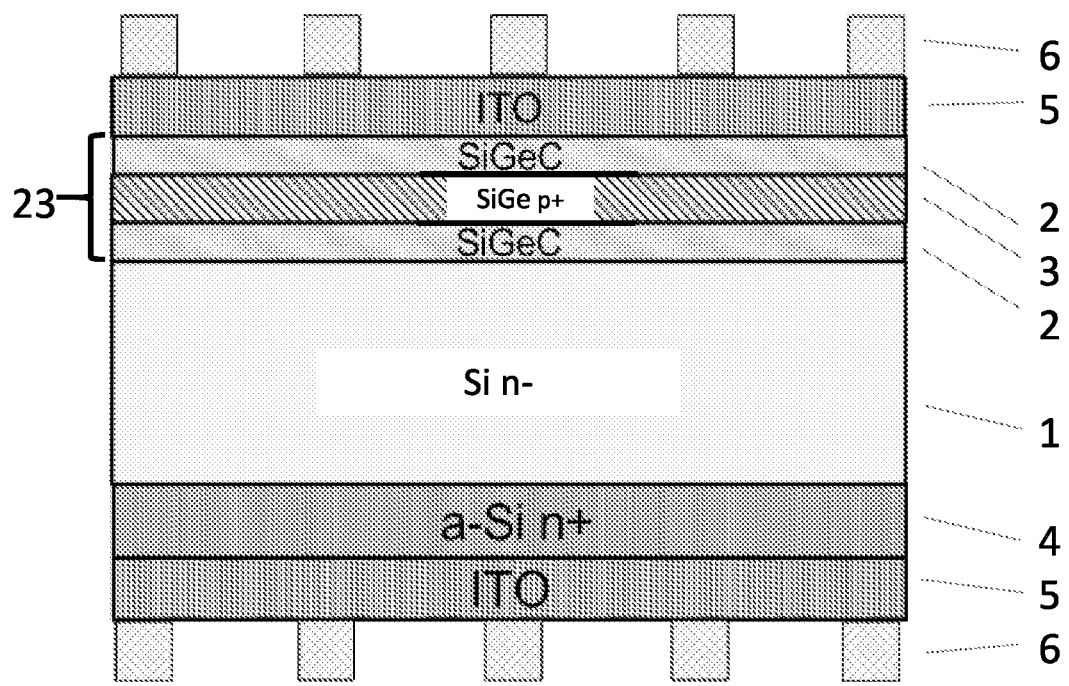
FIGS. 1 and 3 show schematic sectional views of exemplary embodiments of semiconductor devices described herein.
Figure 2:
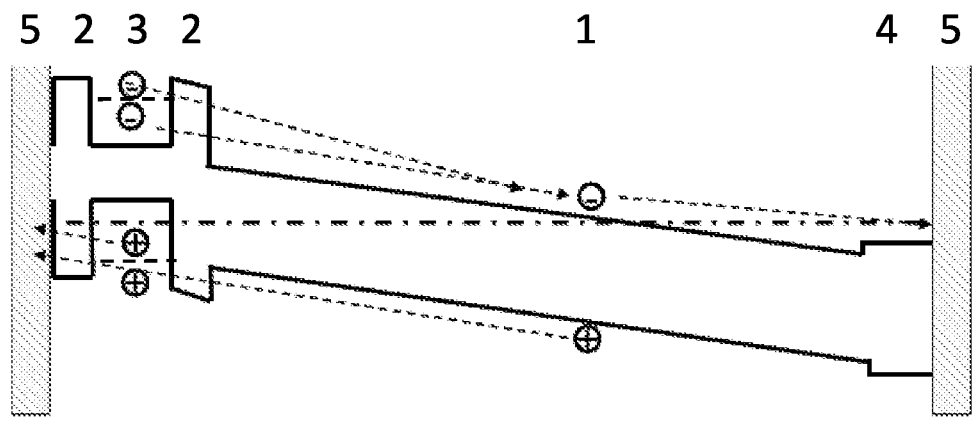
FIGS. 2 and 4 show schematic illustrations of the band structures of the semiconductor devices of FIGS. 1 and 3.

FIGS. 1 and 2 show an example of a semiconductor component 10 in the form of a single-stage solar cell with a highly doped emitter made of a SiGe quantum structure. In this case, FIG. 1 describes the layer structure and FIG. 2 describes the electrical band structure.

Starting from a low-doped 1-2 Ω-cm n-type PV wafer 1, a quantum structure emitter 23 consisting of a triple layer 2, 3, 2 is located on a top side. The two outer layers 2 are each a layer of SiC, GeC or SiGeC. These layers 2 are distinguished above all in that they have a significantly higher band gap than Si. In the case of Si, the band gap is approximately 1.1 eV, whereas the band gap of the layers 2, as shown in FIG. 2, is typically between 2 eV and 3.4 eV.

It is also possible for these layers 2 to be formed, for example, of $SiO_2$ or $Al_2O_3$ in order to form so-called tunnel barriers. This function also determines the thickness of the layers 2, which is particularly preferably less than 10 nm, in order to achieve a significant tunnel effect. Typically, the thickness of these layers 2 is between one atom monolayer and 7 nm.

The middle layer 3 is made of a lower bandgap material, for example, of Si, Ge or SiGe. However, III-V semiconductor materials are also possible for this layer 3, such as InP or GaInP. The advantage of the SiGe used here is that Ge has a substantially higher absorption coefficient than Si.

The middle layer 3 has two functions at the same time. On the one hand, it is intended to form a quantum well on the basis of its position and, on the other hand, it should serve as an emitter of the proposed solar cell. The position between the two tunnel barriers 2 with a large band gap leads to the formation of mini-bands or sub-bands in the quantum well. As a result, short-wavelength photons can also be converted into electron-hole pairs. It can also be assumed that multi-electron effects occur which lead to a current increase in relation to conventional solar cells towards the exterior.

Therefore, this middle layer 3 is highly doped, for example, as illustrated here with boron, and thus forms a hole-conducting region. The doping should be above the degenerate, that is, the doping must be so high that the valence band EV—see the lower thick line in FIGS. 2 and 4—is, as in a metal, above the Fermi level EF—see the dashed line in FIGS. 2 and 4. Typically, in the case of SiGe having 20% to 50% Ge, the p-type doping of the middle layer 3 is $8\text{-}20\times10^{18}$ 1/cm$^3$. In this case the emitter layer 3 serves as a contact layer.

For example, a transparent conductive oxide, for example TCO, can be applied to the emitter layer 3 as an electrically conductive layer 5. This may be, for example, indium tin oxide, ITO for short. The rear side of the solar cell consists of a highly doped layer 4, here of the n-type, which is preferably also doped beyond the degenerate. For Si, this is the case above $2\times10^{19}$ 1/cm$^3$. In this case, the layer can be monocrystalline, polycrystalline or even amorphous.

Figure 3:
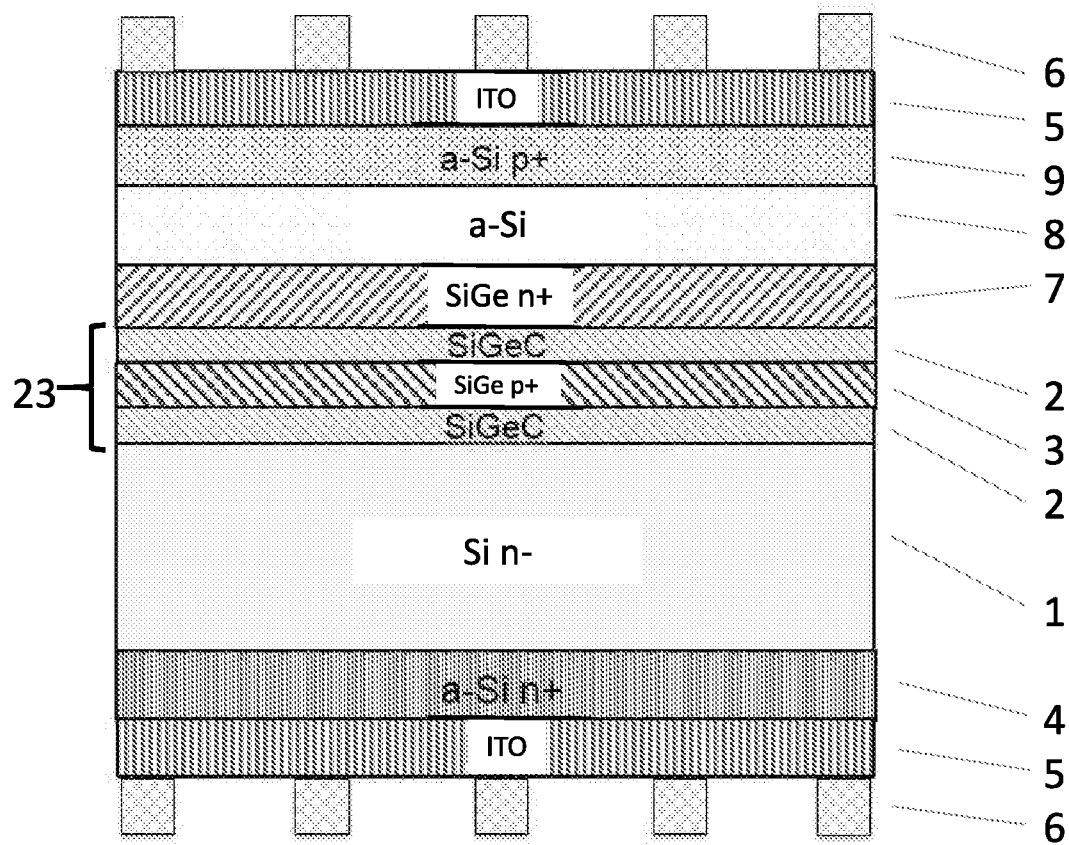
Figure 4:
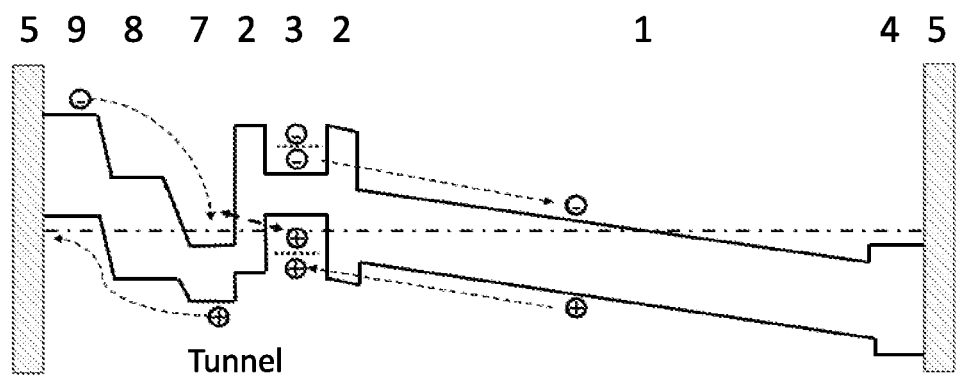

In the solar cells shown in FIGS. 1 and 3, the light entry surfaces are at the top, which in FIGS. 2 and 4, respectively, corresponds to the left. Electrical contact structures 6 are, for example, silver fingers which serve as current tapping, that is, which are intended to dissipate the current generated in the solar cell in a low-resistance manner. These fingers 6 can also easily be formed from another metal with high electrical conductivity, such as copper.

The solar cell illustrated in FIGS. 1 and 2 has the advantage that it is easy to manufacture and provides a larger short-circuit current Isc than conventional solar cells. However, no significantly higher open terminal voltage Voc is provided in the normal case. This is due, for example, to the fact that the open terminal voltage Voc is also determined by the band gap of the materials used, which is, in the case of Ge contents of 20% to 50% in the emitter layer 3, at 0.7 eV to 1 eV.

Therefore, the single stage solar cell of FIGS. 1 and 2 is expanded to a two stage tandem cell as shown in FIGS. 3 and 4. In this case, the layer structure can be based on the layer structure described above in FIG. 1. The layer structure is thus supplemented by the layers 7, 8, 9.

In this case, these semiconductor layers 7, 8, 9 form a second diode with a higher band gap. In this case, the layers 3, 7 form a band-to-band tunnel contact in order to electrically connect the two cells in series. This contact is designed in SiGe with a germanium proportion of more than 30% in order to increase the tunnel probability. For example, the first layer 7 is doped with As with more than $2\times10^{19}$ 1/cm$^3$ and preferably has a thickness between 20 nm and 80 nm inclusive.

The second semiconductor layer 8 is preferably an intrinsic, amorphous Si layer, for example, having a thickness between 10 nm and 40 nm, in particular around 20 nm. The contact layer 9 is in particular a highly doped a-Si layer, likewise with a thickness of around 20 nm, for example, of at least 10 nm and at most 40 nm. The contacts 5, 6 are formed at the top and bottom, as in FIG. 1, preferably each composed of a TCO layer 5 and a metal grid 6.

Unless indicated otherwise, the components shown in the figures in each case preferably follow one another directly in the specified sequence. Layers which are not in contact in the figures are preferably spaced apart from one another. If lines are drawn parallel to one another, the corresponding surfaces are preferably likewise aligned parallel to one another. Likewise, unless indicated otherwise, the relative positions of the illustrated components with respect to one another are correctly reproduced in the figures.

The invention described here is not limited by the description with reference to the exemplary embodiments. Rather, the invention comprises each novel feature and any combination of features, including, in particular, any combination of features in the claims, even if this feature or combination itself is not explicitly recited in the claims or embodiments.

The invention claimed is:

1. A semiconductor component comprising:
 a quantum structure emitter having a first layer made of an undoped semiconductor material with a large band gap, a second, middle, highly doped layer made of a semiconductor material with a low band gap, and a third, undoped layer made of a semiconductor material with a large band gap, wherein the quantum structure emitter forms at least a part of a first diode; and
 a second diode having a fourth layer, a fifth layer and a sixth layer,
 wherein the second diode is made of other semiconductor materials with larger or smaller band gaps than those of the first diode and is attached to the first diode,
 wherein the first layer and the third layer are composed of $(Si_yGe_{1-y})_{1-x}C_x$ with $0 \leq y \leq 1$ and $0.05 \leq x \leq 0.5$ and the second layer is composed of Si, Ge or SiGe,
 wherein the fourth layer is made of SiGe with a germanium proportion of more than 30% and directly adjoins the third layer,
 wherein the fifth layer diode directly following the fourth layer is an intrinsic amorphous Si layer,
 wherein the sixth layer directly following the fifth layer is a contact layer made of highly doped a-Si, and
 wherein the semiconductor component is a solar cell.

2. The semiconductor component according to claim 1, wherein the band gap of the first and third layers is at least 1.5 eV, and
 wherein the band gap of the second layer is at most 0.9 eV and a dopant concentration is at least $5\times10^{18}$1/cm$^3$.

3. The semiconductor component according to claim 2, wherein the quantum structure emitter consists essentially of the first to third layers.

4. The semiconductor component according to claim 3, wherein the first to third layers extend in a planar and continuous manner over the quantum structure emitter.

5. The semiconductor component according to claim 1, wherein each layer of the quantum structure emitter fulfills tunnel conditions.

6. The semiconductor component according to claim 5, wherein a total thickness of the quantum structure emitter is at most 10 nm such that the quantum structure emitter overall meets the tunnel conditions.

7. The semiconductor component according to claim 1, wherein the second layer is doped until degenerate.

8. The semiconductor component according to claim 1, wherein the layers of the quantum structure emitter are monocrystalline or polycrystalline.

9. The semiconductor component according to claim 1, wherein the layers of the quantum structure emitter are monocrystalline.

10. The semiconductor component according to claim 1, wherein the layers of the quantum structure emitter are polycrystalline.

11. The semiconductor component according to claim 1, wherein the second layer is composed of SiGe.

12. The semiconductor component according to claim 11, wherein the second layer is composed of SiGe with 20%-50% Ge and $5\times10^{18}$ 1/cm$^3$.

13. The semiconductor component according to claim 1, wherein the second layer is $Si_zGe_{1-z}$ with $0.6\leq z\leq 0.9$.

14. The semiconductor component according to claim 1, wherein the first layer and the third layer are composed of $(Si_yGe_{1-y})_{1-x}C_x$ with $0.25\leq y\leq 0.9$ and $0.05\leq x\leq 0.5$.

15. The semiconductor component according to claim 1, wherein the fourth layer has a thickness between 20 nm and 80 nm, inclusive, the fifth layer has a thickness of between 10 nm and 40 nm, inclusive and the sixth layer has a thickness of between 10 nm and 40 nm, inclusive.

16. The semiconductor component according to claim 1, further comprising a transparent conductive oxide layer (TCO) directly located on the sixth layer.

17. The semiconductor component according to claim 16, further comprising an electrical contact structure directly located on the TCO layer, the electrical contact structure including Ag or Cu.

* * * * *